US009976691B2

(12) United States Patent
Chin et al.

(10) Patent No.: US 9,976,691 B2
(45) Date of Patent: May 22, 2018

(54) ELEVATABLE SUPPORTING DEVICE

(71) Applicant: SYNCMOLD ENTERPRISE CORP., New Taipei (TW)

(72) Inventors: Chung-Hsien Chin, New Taipei (TW); Chen-Kuei Tsai, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 0 days. days.

(21) Appl. No.: 15/361,205

(22) Filed: Nov. 25, 2016

(65) Prior Publication Data

US 2017/0219158 A1 Aug. 3, 2017

(30) Foreign Application Priority Data

Feb. 3, 2016 (TW) .............................. 105201696 U

(51) Int. Cl.
*H05K 7/16* (2006.01)
*H05K 5/02* (2006.01)
*F16M 11/04* (2006.01)
*F16M 13/02* (2006.01)
*A47F 5/00* (2006.01)
*F16M 11/20* (2006.01)
*F16M 11/22* (2006.01)
(Continued)

(52) U.S. Cl.
CPC ....... *F16M 11/046* (2013.01); *F16M 11/2014* (2013.01); *F16M 11/22* (2013.01); *A47B 9/02* (2013.01); *F16M 11/24* (2013.01); *F16M 13/022* (2013.01); *F16M 2200/047* (2013.01); *F16M 2200/048* (2013.01); *H05K 5/0234* (2013.01)

(58) Field of Classification Search
CPC .. F16M 11/046; F16M 11/2014; F16M 11/10; F16M 11/22; F16M 11/24; F16M 2200/047; F16M 13/022; F16M 2200/048; F16M 11/00; A47B 9/02
USPC ... 248/123.11, 123.1, 125.1, 274.1, 286.1, 1, 248/297.11, 188.2, 917
See application file for complete search history.

(56) References Cited

U.S. PATENT DOCUMENTS 7,413,150 B1 * 8/2008 Hsu ........................ F16M 11/10
248/123.11
7,681,845 B1 * 3/2010 Chang .................. F16M 11/105
248/161

(Continued)

FOREIGN PATENT DOCUMENTS

TW       M471737 U    2/2014
WO    WO-2010/004674 A1  1/2010

*Primary Examiner* — Tan Le
(74) *Attorney, Agent, or Firm* — Muncy, Geissler, Olds & Lowe, P.C.

(57) ABSTRACT

An elevatable supporting device for holding a display module which is defined with a normal direction is provided. The elevatable supporting device comprises a frame, at least one rail module, a sliding element, and at least one constant force spring. The rail module includes an outer rail and an inner rail, wherein the outer rail is fastened to the frame and formed with a lateral opening for the inner rail sliding therein. The sliding element is formed with an inner space for the rail module penetrating through. The sliding element is secured to the inner rail so as to slide on the frame. The constant force spring is disposed on the top of the frame and connects to the sliding element at a free end thereof. Thus, the elevatable supporting device is characterized in having a slim structure.

19 Claims, 17 Drawing Sheets

(51) Int. Cl.
*F16M 11/24* (2006.01)
*A47B 9/02* (2006.01)

(56) References Cited

U.S. PATENT DOCUMENTS

| | | | |
|---|---|---|---|
| 7,780,125 B2 * | 8/2010 | Yen | F16M 11/10 |
| | | | 248/125.1 |
| 7,793,897 B2 * | 9/2010 | Wang | F16M 11/10 |
| | | | 248/121 |
| 8,047,479 B2 * | 11/2011 | Liu | F16M 11/105 |
| | | | 248/157 |
| 8,272,617 B2 | 9/2012 | Huang | |
| 9,702,501 B2 * | 7/2017 | Ho | F16M 11/046 |

* cited by examiner

ELEVATABLE SUPPORTING DEVICE

CROSS REFERENCE TO RELATED APPLICATION

This application claims the benefits of the Taiwan Patent Application Serial Number 105201696, filed on Feb. 3, 2016, the subject matter of which is incorporated herein by reference.

BACKGROUND OF THE INVENTION

1. Field of the Invention

The present invention relates to an elevatable supporting device, more specifically, to an elevatable supporting device used for holding a display module.

2. Description of Related Art

A conventional elevatable structure, having a guide rail which is used in a supporting device for supporting a display, is disclosed in Taiwan Patent No. M471737. The conventional elevatable structure comprises a supporting frame, a first rail module and a sliding device. The supporting frame comprises a main board and two side boards extending from two sides of the main board. The first rail module is disposed on the main board of the supporting frame and has a first outer rail and a first inner rail. The inner rail is slidably disposed in a first opening of the first outer rail. The first opening is fixed on the supporting frame to face toward or backward the main board.

Because the sliding device only surrounds the first rail module and the main board is disposed outside the sliding device, the width of the main board is larger than the width of the sliding device. Therefore, the elevatable structure is visually too wide so as to be too bulky in view of the users.

Accordingly, developing a novel elevatable supporting device is urgently needed in this field.

SUMMARY OF THE INVENTION

The object of the present invention is to provide an elevatable supporting device wherein a single lateral rail module and portions of a frame are arranged in an inner space defined by a sliding element so as to use space more effectively and to reduce width of the structure. Therefore, the supporting device of the present invention can be slim especially on the user's view angle.

To achieve the abovementioned objects, the present invention discloses an elevatable device for holding a display module. The display module defines with a normal direction. In one embodiment of the present invention, the elevatable device comprises a frame, a first rail module, a sliding element and a first constant force spring. The first rail module has a first outer rail and a first inner rail. The first outer rail is fastened to the frame and is forming a first opening. The first opening faces toward a first lateral direction with respect to the normal direction. The first inner rail is slidably disposed in the first opening. The sliding element forms an inner space for the first rail module penetrating through and the sliding element is fastened to the first inner rail so as to slide on the frame. The first constant force spring is disposed above the first outer rail and has a free end to be fastened to the sliding element.

The sliding element includes a central board, a first lateral flange and a second lateral flange. The first lateral flange and the second lateral flange extend from two opposite sides of the central board respectively and substantially perpendicular to the central board so that the sliding element substantially has a U-shaped configuration. The central board, the first lateral flange and the second lateral flange define the inner space so as to surround the first rail module. A direction of an opening of the sliding element is opposite to the normal direction, and the first lateral direction of the first outer rail is perpendicular to the normal direction. The first rail module has a first thickness with respect to the normal direction and has a first width with respect to the first lateral direction, and the sliding element has a second thickness with respect to the normal direction, wherein the second thickness is less than the first width and the second thickness is greater than the first thickness.

The frame has two platforms, and a first top board and a first bottom board of the first outer rail are fastened to the platforms respectively.

In another embodiment, the elevatable supporting device further comprises a second rail module disposed in the inner space and surrounded by the central board, the first lateral flange and the second lateral flange, wherein the second rail module has a second outer rail and a second inner rail, wherein the second outer rail forms a second opening, the second inner rail is slidably disposed in the second opening, the second outer rail is fastened to the frame, the second opening faces toward a second lateral direction with respect to the normal direction, the second lateral direction and the first lateral direction of the first opening are opposite and both substantially perpendicular to the normal direction, and the second inner rail is fastened to the second lateral flange.

The second rail module has a third thickness with respect to the normal direction and has a second width with respect to the second lateral direction, wherein the second thickness is less than the second width and the second thickness is greater than the third thickness.

In one embodiment of the present invention, the elevatable supporting device further comprises a second constant force spring disposed above the second outer rail, wherein the free end of the first constant force spring is fastened to the first lateral flange, and a free end of the second constant force spring is fastened to the second lateral flange.

A second top board and a second bottom board of the second outer rail are fastened to the platforms respectively. In one embodiment, a first back board of the first outer rail is attached with a second back board of the second outer rail.

In another embodiment of the present invention, the elevatable supporting device comprises a frame having a first standing board, a second standing board and a third standing board disposed between the first lateral flange and the second lateral flange, wherein the first standing board is attached with a first back board, the second standing board and the third standing board are connected with two ends of the first standing board and perpendicular to the first standing board, and the third standing board is adjacent to the central board. The frame has a back board for the second standing board being fastened thereto.

The elevatable supporting device further comprises a first friction structure having a plurality of first friction blocks disposed on the first lateral flange and the second lateral flange respectively. The frame further has two forth standing boards connected with two ends of the second standing board, wherein the first friction blocks contact with the forth standing board or the first standing board or the second standing board.

The sliding element further includes a second friction structure having an adjusting button and a second friction block, wherein the adjusting button is capable of selectively adjusting a normal force on the second friction block against the third standing board.

In one embodiment of the present invention, the first standing board, the second standing board and the third standing board define a first groove for the first rail module being disposed therein.

The second back board of the second outer rail is attached on the first standing board, and the first back board of the first outer rail faces toward the second back board of the second outer rail. In more detail, in one embedment of the present invention, the first standing board, the second standing board and the third standing board define a first groove and a second groove, wherein the first rail module is received in the first groove, and the second rail module is received in the second groove.

The elevatable supporting device further comprises a holding module connecting to the sliding element. The holding module is utilized to connect to the display module.

The elevatable supporting device further comprises a receiving element disposed on the platforms. A first winding portion of the first constant force spring and a second winding portion of the second constant force spring are disposed on the receiving element. The first winding portion of the first constant force spring defines a first central axis, the second winding portion of the second constant force spring defines a second central axis, wherein the first central axis and the second central axis are in parallel and perpendicular to the first lateral direction.

The receiving element has a first receiving recess and a second receiving recess to accommodate the first winding portion and the second winding portion respectively, wherein the first receiving groove and the second receiving groove are at different height so that a projection of the first winding portion projected on the platforms partially overlaps a projection of the second winding portion projected on the platforms.

The detailed technology and preferred embodiments implemented for the subject invention are described in the following paragraphs accompanying the appended drawings for people skilled in this field to well appreciate the features of the claimed invention.

DETAILED DESCRIPTION OF THE PREFERRED EMBODIMENT

Figure 1:
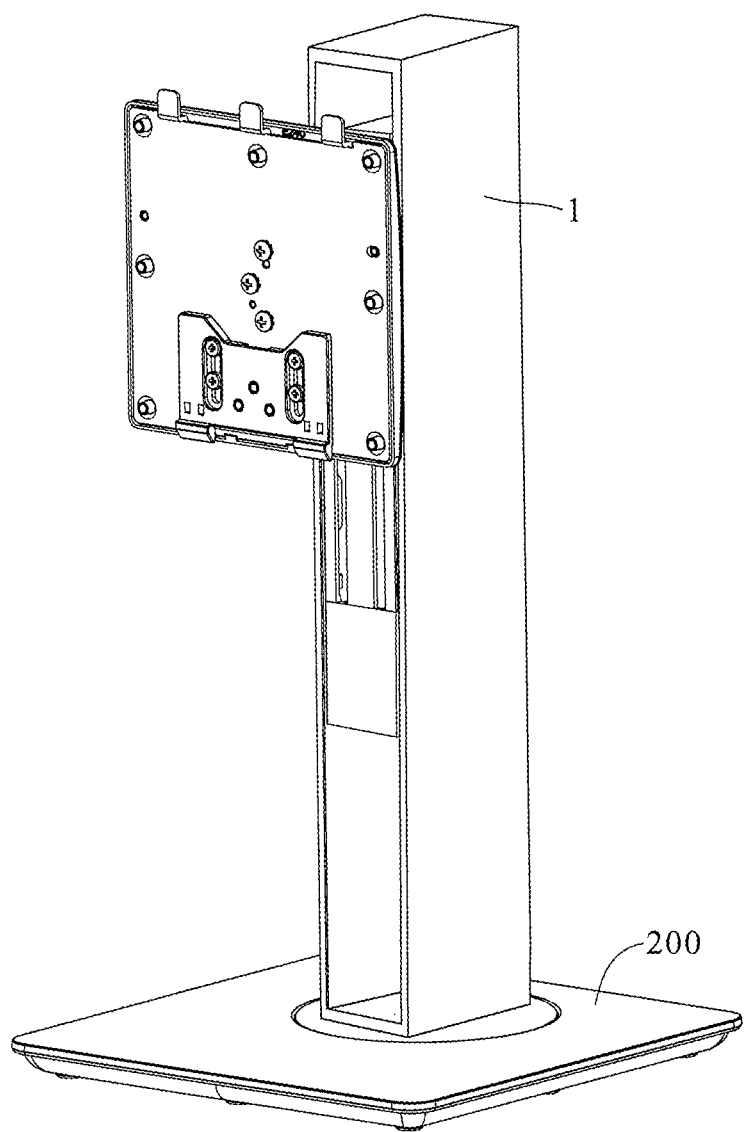
FIG. 1 is an external view of the elevatable supporting device of the present invention.
Figure 2:
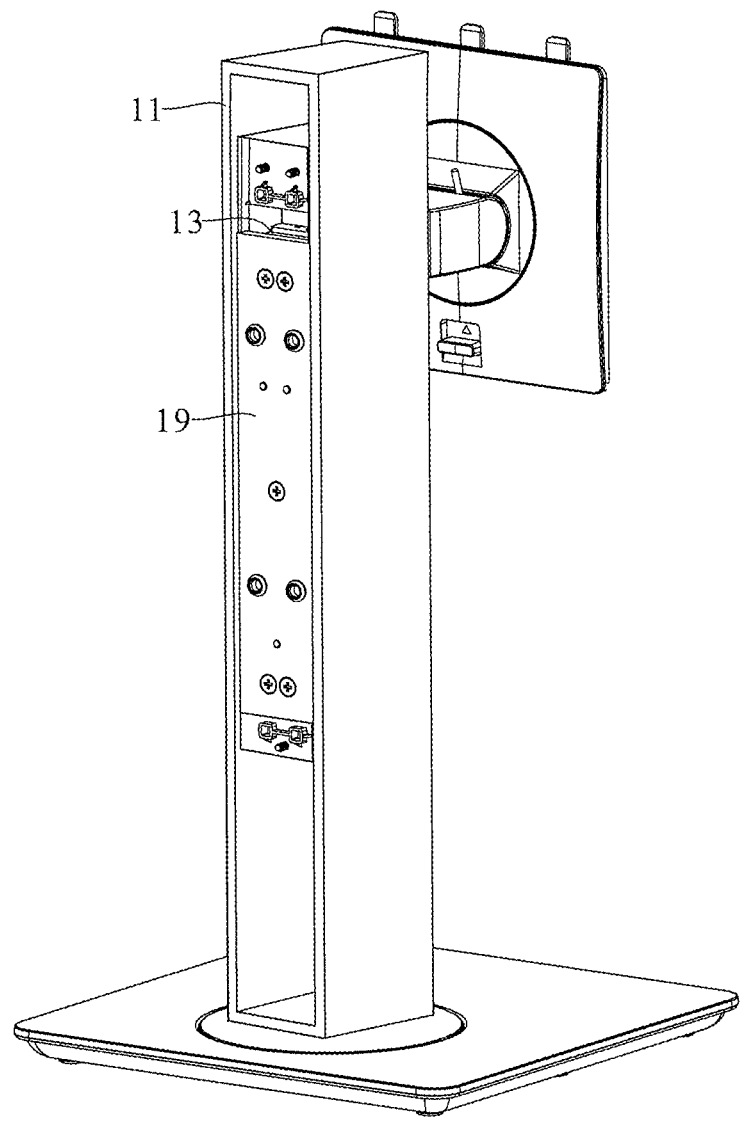
FIG. 2 is another external view of the elevatable supporting device of the present invention.
Figure 3:
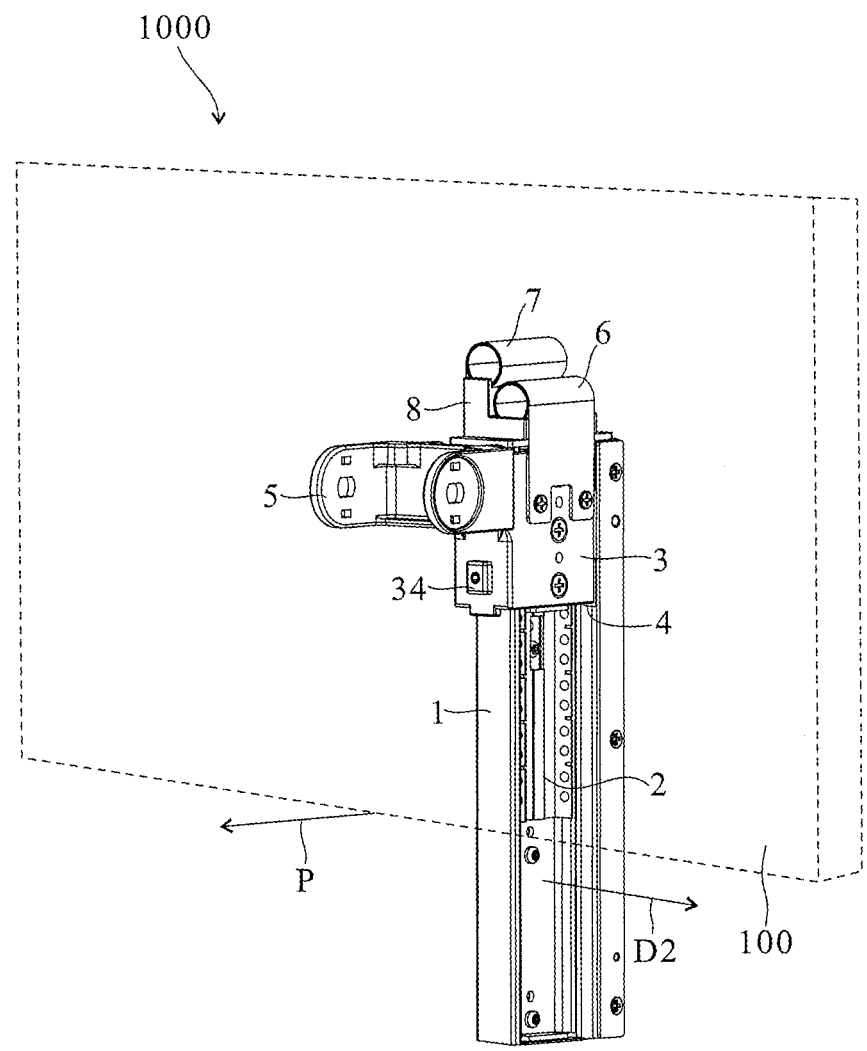
FIG. 3 is a perspective view of the first embodiment of the elevatable supporting device of the present invention.
Figure 4:
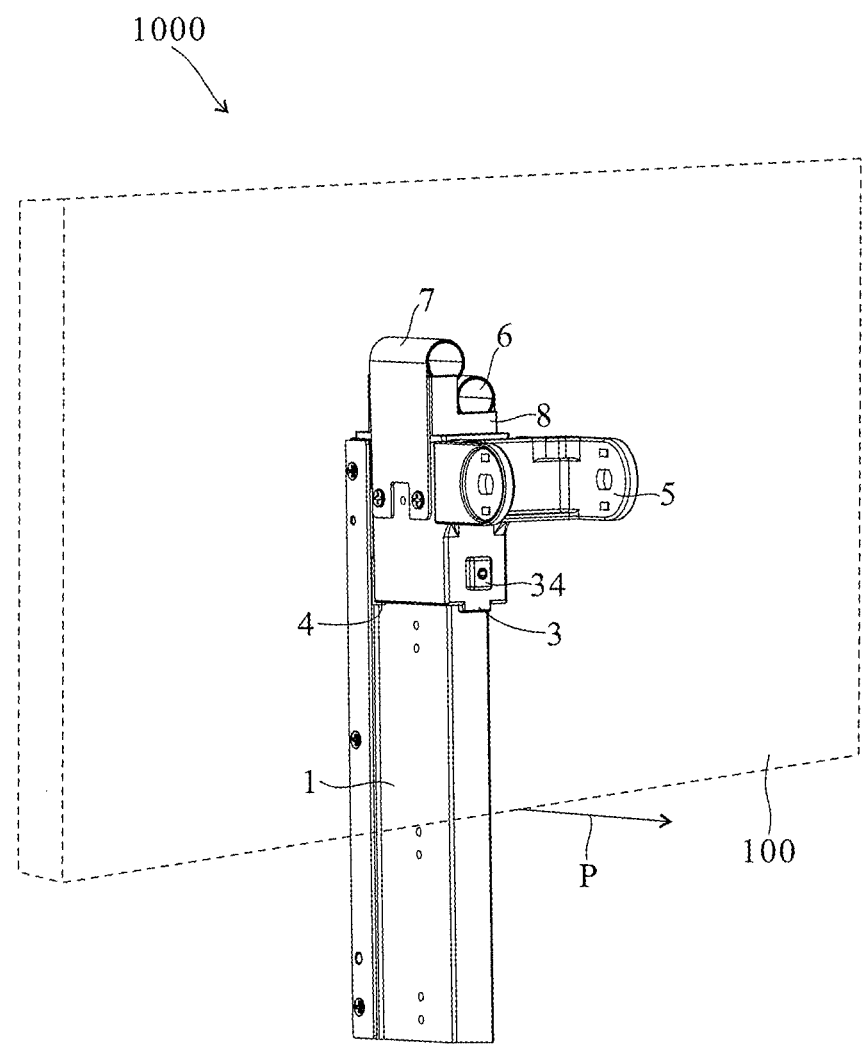
FIG. 4 is another perspective view of the first embodiment of the elevatable supporting device of the present invention.
Figure 5:
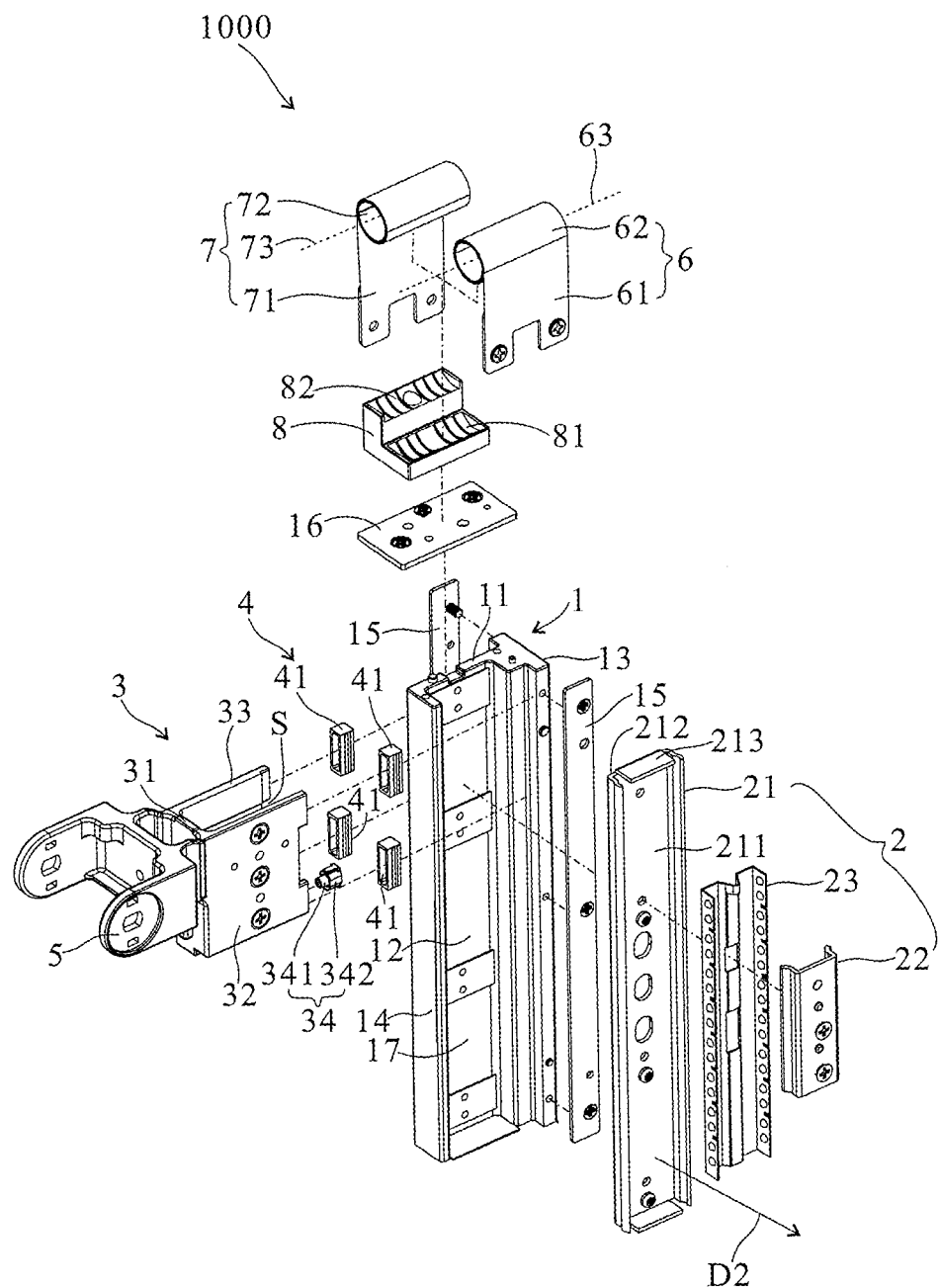
FIG. 5 is an exploded perspective view of the first embodiment of the elevatable supporting device of the present invention.

FIG. 1 and FIG. 2 are external views of the elevatable supporting device 1000 of the present invention. FIG. 3 to FIG. 5 are partial views showing the interior structure of the first embodiment of the elevatable supporting device 1000 wherein FIG. 3 and FIG. 4 show the interior structure in different view angles and FIG. 5 is an exploded perspective view of the present embodiment. The elevatable supporting device 1000 of the present embodiment is used for holding a display module 100. The display module 100 defines a normal direction P which is perpendicular to a screen of the display module. In more detail, when the elevatable supporting device 1000 is arranged on a horizontal surface, the display module 100 is perpendicular to the horizontal surface so as to define the normal direction P. The elevatable supporting device 1000 comprises a frame 1, a first rail module 2, a sliding element 3, a first friction structure 4, a holding body 5, a first constant force spring 6 and a second constant force spring 7. The frame 1 has a structure for bearing the weight of display module 100. The frame 1 is disposed on a base 200 and is rotatable with respect to the base 200.

The first rail module 2 is a ball bearing slide in this embodiment. The first rail module 2 has a first outer rail 21, a first inner rail 22 and ball bearings 23. The first outer rail 21 is fastened to the frame 1 and forms a first opening 211. The first opening 211 is facing toward a first lateral direction D2 which is substantially perpendicular to the normal direction P. The first inner rail 22 is slidably disposed in the first opening 211. Preferably, the ball bearings 23 is disposed between the first outer rail 21 and the first inner rail 22 so that the first inner rail 22 is adapted to slide on the ball bearings 23 with respect to the first outer rail 21. The sliding element 3 forms an inner space S for the first rail module 2 to penetrate through. The sliding element 3 is fastened to the first inner rail 22 so as to slide on the frame 1.

The holding body 5 connects with the sliding element 3 and the holding body 5 is adapted to connect with the display module 100. The first constant force spring 6 and a second constant force spring 7 are disposed above the first rail module 2. A free end 61 of the first constant force spring 6 and a free end 71 of the second constant force spring 7 are fastened to the sliding element 3 so that the first constant force spring 6 and the second constant force spring 7 can provide a constant bearing force to the sliding element 3. The first friction structure 4 is disposed on the sliding element 3 to contact with the frame 1. When the sliding element 3 is sliding, the first friction structure 4 rubs against the frame 1 to generate a friction force. The user can leave the elevatable supporting device 100 at any location because of the bearing force provided by the first constant force spring 6 and the second constant force spring 7 and the friction force generated by the first friction structure 4 rubbing the frame 1.

Figure 6:
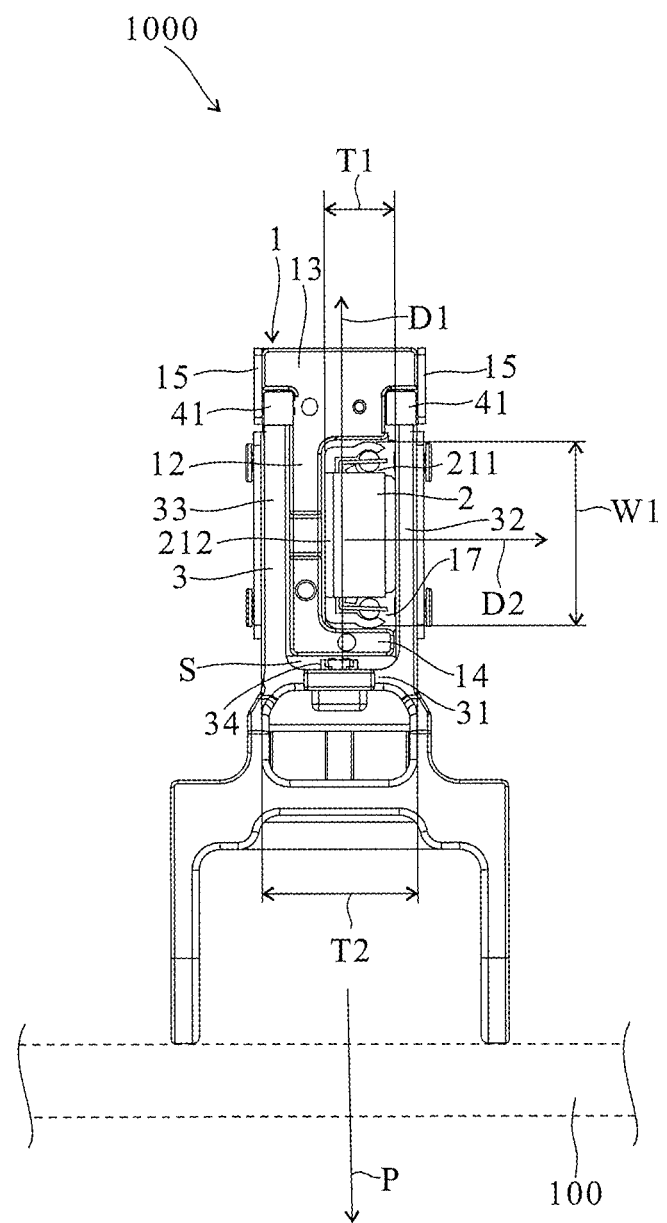
FIG. 6 is a partial top view of the first embodiment of the elevatable supporting device of the present invention.

Referring to FIG. 5, the slide element 3 includes a central board 31, a first lateral flange 32 and a second lateral flange 33. The first lateral flange 32 and the second lateral flange 33 extend from two opposite sides of the central board 31 respectively and are perpendicular to the central board 31 so that the sliding element 3 substantially has a U-shaped configuration. The central board 31, the first lateral flange 32 and the second lateral flange 33 define the inner space S so as to surround the first rail module 2. The first lateral flange 32 is fastened to the first inner rail 22. Referring to FIG. 6, which is the partial top view of the present embodiment, a direction D1 of the opening of the sliding element 3 is opposite to the normal direction P. The first lateral direction D2 of the first opening 211 of the first outer rail 21 is perpendicular to the normal direction P. That is to say, when the normal direction P is facing forward, the opening of the slide element 3 is facing backward and the first lateral direction D2 of the first opening 211 of the first outer rail 21 is facing sideways. Because the first rail module 2 and the frame 1 are at least partially disposed in the inner space S and penetrate through the inner space S, the first rail module 2 has a first thickness T1 with respect to the normal direction P and has a first width W1 with respect to the first lateral direction D2. The sliding element 3 has a second thickness T2 with respect to the normal direction P. In the present embodiment, the second thickness T2 is less than the first width W1, and the second thickness T2 is greater than the first thickness T1. Therefore, the inner space S of the elevatable supporting device 1000 can be used more effectively to reduce the volume and thus the elevatable supporting device 1000 can be slimmer in view of the normal direction P. That is to say, a thinner type frame can be obtained because of the smaller thickness of the first rail module and the sliding element in the user's viewing angle.

The detailed structure of the frame 1 of the present embodiment is further described hereinbelow. The frame 1 has a frame body 11, a first standing board 12, a second standing board 13 and a third standing board 14 opposite to the second standing board 13, two forth standing boards 15, a platform 16 and a back board 19. The second standing board 13 and the third standing board 14 are connected with two ends of the first standing board 12 and are perpendicular to the first standing board 12 so that the first standing board 12, the second standing board 13 and the third standing board 14 define a first groove 17. The forth standing boards 15 are connected with two ends of the second standing board 13. The platform 16 is disposed above the first standing board 12 of the frame 1 and is fastened to the second standing board 13. It should be noted that after the second standing board 13 and the back board 19 screw together, two lateral flanges of the back board 19 joint two inner sides of the frame body 11 so that the second standing board 13 is fastened to the frame body 11 through the back board 19.

The frame 1, the sliding element 3 and the rail module 2 are described hereinbelow. The first standing board 12 is disposed between the first lateral flange 32 and the second lateral flange 33, and the first rail module 2 is disposed in the first groove 17 so that the first back board 212 of the first outer rail 21 is attached and fastened to the first standing board 12. The third standing board 14 is adjacent to the central board 31.

The first friction structure 4 has a plurality of first friction blocks 41 disposed on the first lateral flange 32 and the second lateral flange 33 respectively. The first standing board 12, the second standing board 13 and the forth standing board 15 form a receiving space for accommodating the first friction blocks 41. The first friction blocks 41 contact with the first standing board 12, the second standing board 13 and the forth standing board 15. Thereby, when the sliding element 3 slides up and down with respect to the frame 1, the friction force is generated by the first friction blocks 41 rubbing against the first standing board 12, the second standing board 13 and the forth standing board 15. The friction force and the bearing force provided by the first constant force spring 6 and the second constant force spring 7 can counterbalance the weight of the display module 100 so that the display module 100 can stop at any location. In another embodiment of the present invention, the first friction blocks 41 can only contact with the first standing board 12 or the second standing board 13 or the forth standing board 15 so as to control the contact area between the friction blocks and the frame 1. The number of the first friction blocks 41 is also adjustable so as to adjust the friction force.

The first constant force spring 6, the second constant force spring 7 and other related elements are described hereinbelow. As shown in FIG. 5, the first constant force spring 6 has a first winding portion 62 and defines a first central axis 63. The second constant force spring 7 has a second winding portion 72 and defines a second central axis 73. The first central axis 63 and the second central axis 73 are in parallel and are perpendicular to the first lateral direction D2 of the first opening 211. The free end 61 of the first constant force spring 6 is fastened to the first lateral flange 32, and the free end 71 of the second constant force spring 7 is fastened to the second lateral flange 33 so as to provide a constant tensile force to the sliding element 3 and the display module 100 connected thereto. In another embodiment of the present invention, the number of the constant force springs can be adjusted to fit the weight of the display module and is not limited.

A receiving element 8 is disposed on the platform 16 of the frame 1. The receiving element 8 has a first receiving groove 81 and a second receiving groove 82 for accommodating the first winding portion 62 and the second winding portion 72 respectively. The height of the first receiving groove 81 and the height of the second receiving groove 82 are different so that a projection of the first winding portion 62 and a projection of the second winding portion 72 projected on the platform 16 of the frame 1 (or on a horizontal plane) are partially overlapped. That is to say, the first constant force spring 6 and the second constant force spring 7 are arranged in a manner of one being higher than the other. Therefore, the thickness of the elevatable supporting device 1000 with respect to the normal direction P can be reduced.

In addition, to enhance the application and bearing capacity of the first constant force spring 6 and the second constant force spring 7, the sliding element 3 further has a second friction structure 34. The second friction structure 34 has an adjusting button 341 and a second friction block 342. The adjusting button 341 can adjust the normal force of the second friction block 342 giving to the third standing board 14. The adjusting button 341 can be a screw. When the screw is tightened up gradually, the normal force of the second friction block 342 giving to the third standing board 14 increases gradually so that the friction generated by the second friction block 342 and the third standing board 14 increases gradually when the sliding element 3 slides with respect to the frame 1. Thereby, it is able to balance the friction and the bearing force against the weight of the display module 100.

Figure 7:
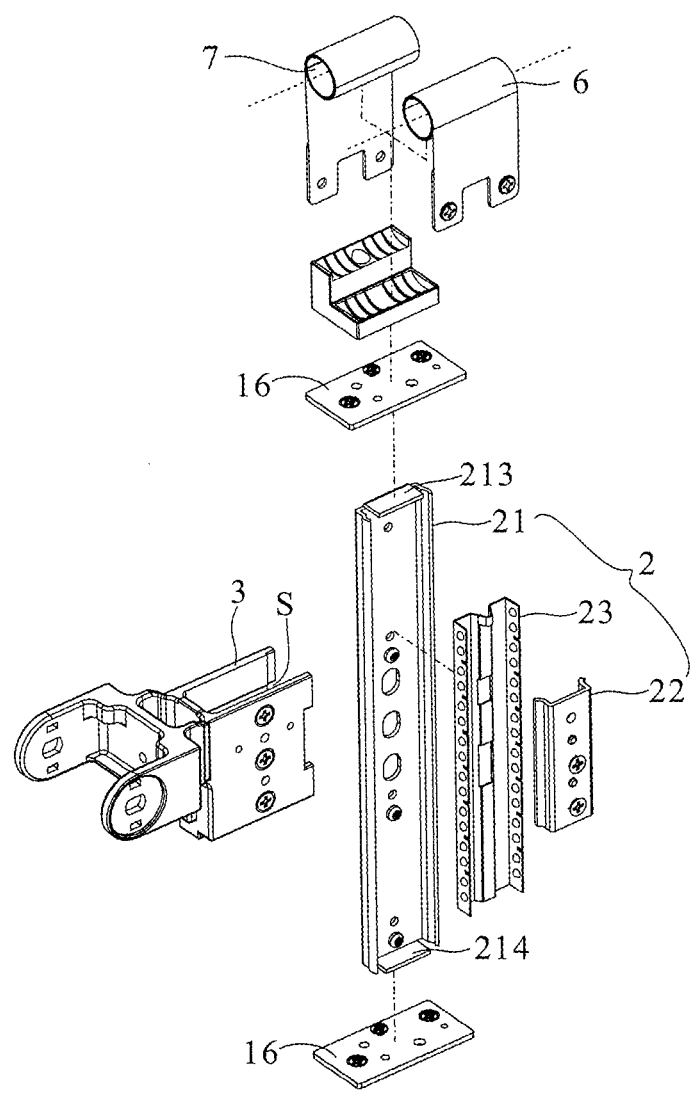
FIG. 7 is a partial exploded view of other embodiments of the elevatable supporting device of the present invention.

In another embodiment of the present invention, as shown in FIG. 7, the frame 1 has two platforms 16. A top board 213 and a bottom board 214 of the first outer rail 21 are fastened to the platforms 16 respectively. The first constant force spring 6 and the second constant force spring 7 are disposed on the platforms 16 and located above the first outer rail 21. Under this circumstance, the first standing board, the second standing board and the third standing board of the aforesaid embodiment can be omitted so that merely the first rail module 2 is disposed in the inner space S of the sliding element 3. In addition, the platforms 16 are able to be fastened to the frame body 11 directly.

Figure 8:
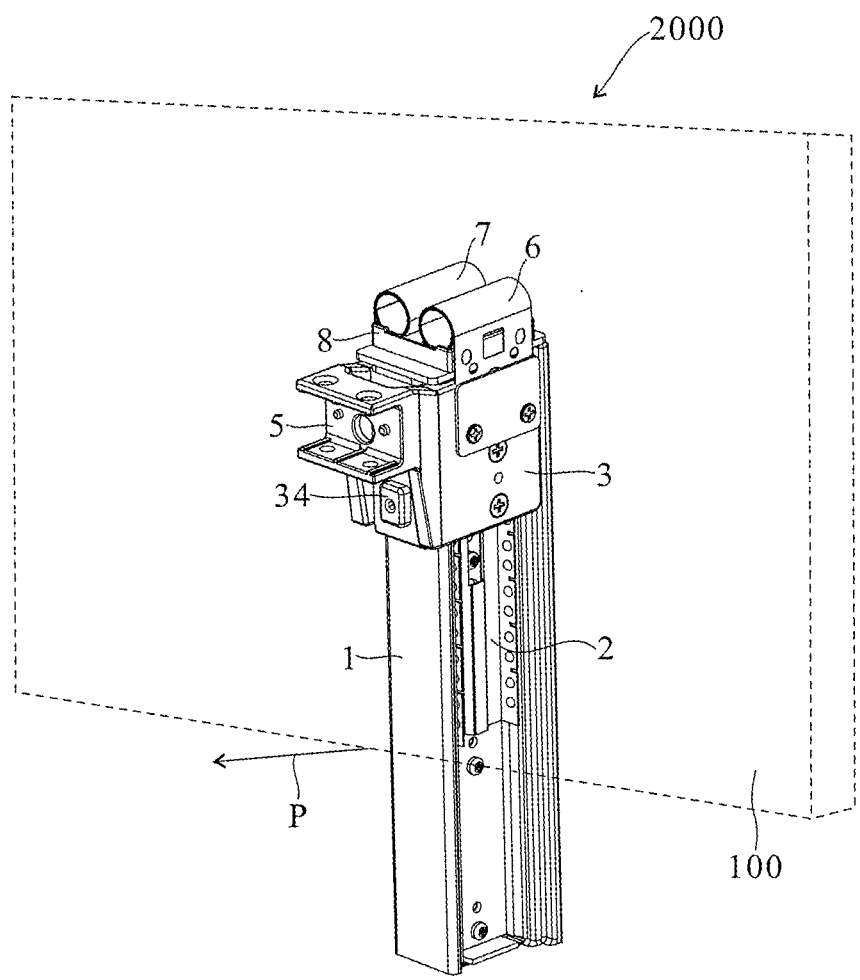
FIG. 8 is a perspective view of the second embodiment of the elevatable supporting device of the present invention.
Figure 9:
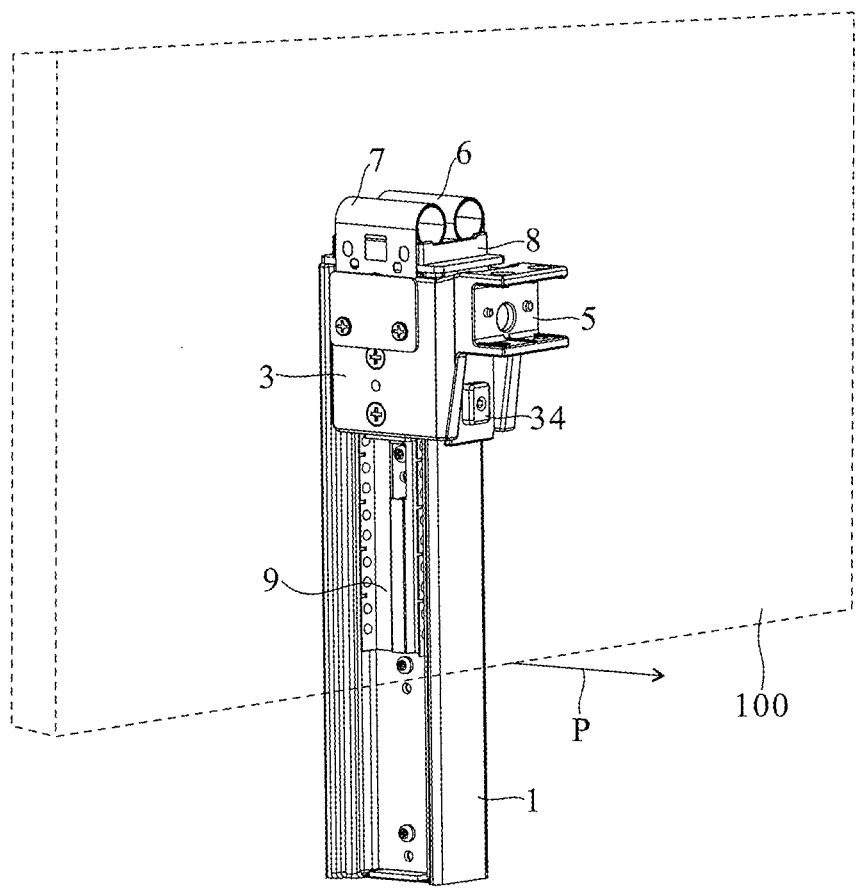
FIG. 9 is another perspective view of the second embodiment of the elevatable supporting device of the present invention.
Figure 10:
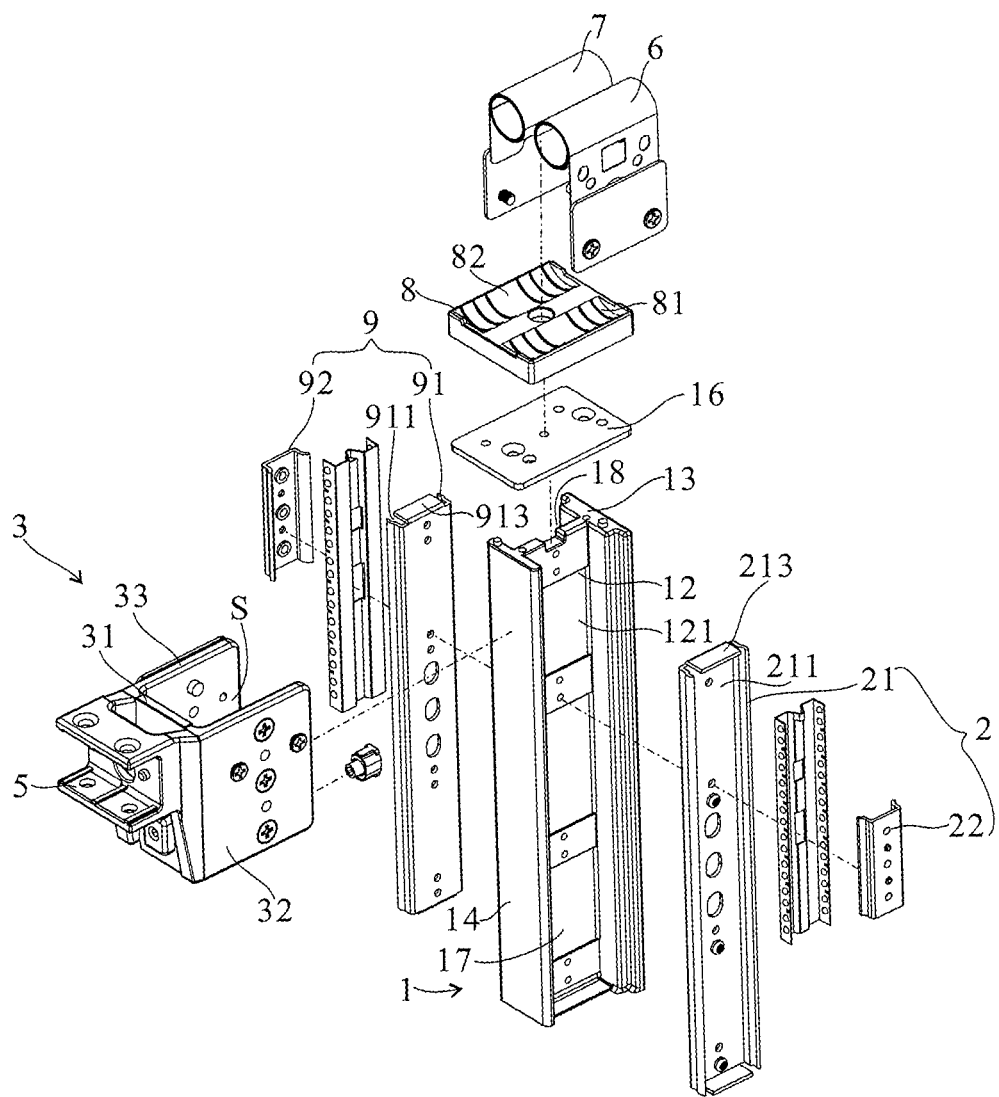
FIG. 10 is an exploded perspective view of the second embodiment of the elevatable supporting device of the present invention.

The second embodiment of the elevatable supporting device 2000 is described hereinbelow. The appearance of this embodiment is similar to the appearance of the first embodiment. FIG. 8 and FIG. 9 are the perspective views showing portions of the inner structure of this embodiment in different view angles. FIG. 10 is an exploded perspective view of this embodiment. The present embodiment discloses a frame 1, a first rail module 2, a sliding element 3, a holding body 5, a first constant force spring 6, a second constant force spring 7 and a second friction structure 34 which are also disclosed in the first embodiment. This embodiment further discloses a second rail module 9. The second rail module 9 is also a ball bearing slide, and it is also disposed in the inner space S as well as being surrounded by the central board 31, the first flange 32 and the second flange 33. The second rail module 9 has a second outer rail 91 and a second inner rail 92. The second outer rail 91 forms a second opening 911. The second inner rail 92 is slidably disposed in the second opening 911. The second inner rail 92 is fastened to the second lateral flange 33, and the first inner rail 22 is fastened to the first lateral flange 32 so that the sliding element 3 is able to slide with respect to the frame 1.

Figure 11:
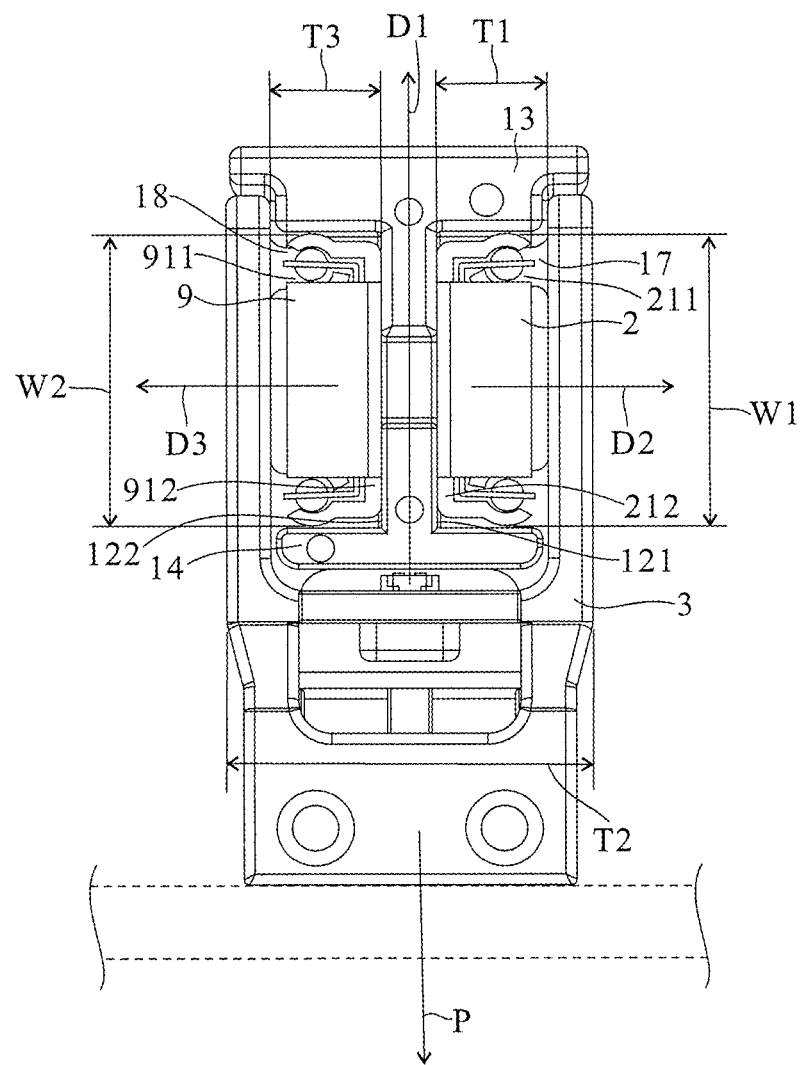
FIG. 11 is a partial top view of the second embodiment of the elevatable supporting device of the present invention.

In the present embodiment, the first standing board 12, the second standing board 13 and the third standing board 14 define a first groove 17 and a second groove 18. With reference to FIG. 11, which is the partial top view of the present embodiment, the first rail module 2 is disposed in the first groove 17, and the second rail module 9 is disposed in the second groove 18. The second opening 911 of the second outer rail 91 faces toward a second lateral direction D3 with respect to the normal direction P. The second lateral direction D3 of the second opening 911 is opposite to the first lateral direction D2 of the first opening 211 and perpendicular to the direction D1 of the opening of the sliding element 3 and the normal direction P. In this embodiment, the first back board 212 of the first outer rail 21 is attached to the first surface 121 of the first standing board 12, and the second back board 912 of the second outer rail 91 is attached to the second surface 122 opposite to the first surface 121 of the first standing board 12 so that the first back board 212 and the second back board 912 are disposed in a manner of back-to-back.

The receiving element 8 of this embodiment is disposed on the platform 16. The receiving element 8 has a first receiving recess 81 and a second receiving recess 82 to receive the first constant force spring 6 and the second constant force spring 7 respectively. However, the difference between the present embodiment and the first embodiment is that the first receiving recess 81 and the second receiving recess 82 are at the same height and are disposed above the first outer rail 21 and the second outer rail 91 respectively.

With reference to FIG. 11, the first rail module 2 has a first thickness T1 with respect to the normal direction P and has a first width W1 with respect to the first lateral direction D2. The second rail module 9 has a third thickness T3 with respect to the normal direction P and has a second width W2 with respect to the second lateral direction D3. The second thickness T2 of the sliding element 3 is less than the first width W1 and the second width W2. The second thickness T2 is greater than the first thickness T1 and the third thickness T3.

Figure 12:
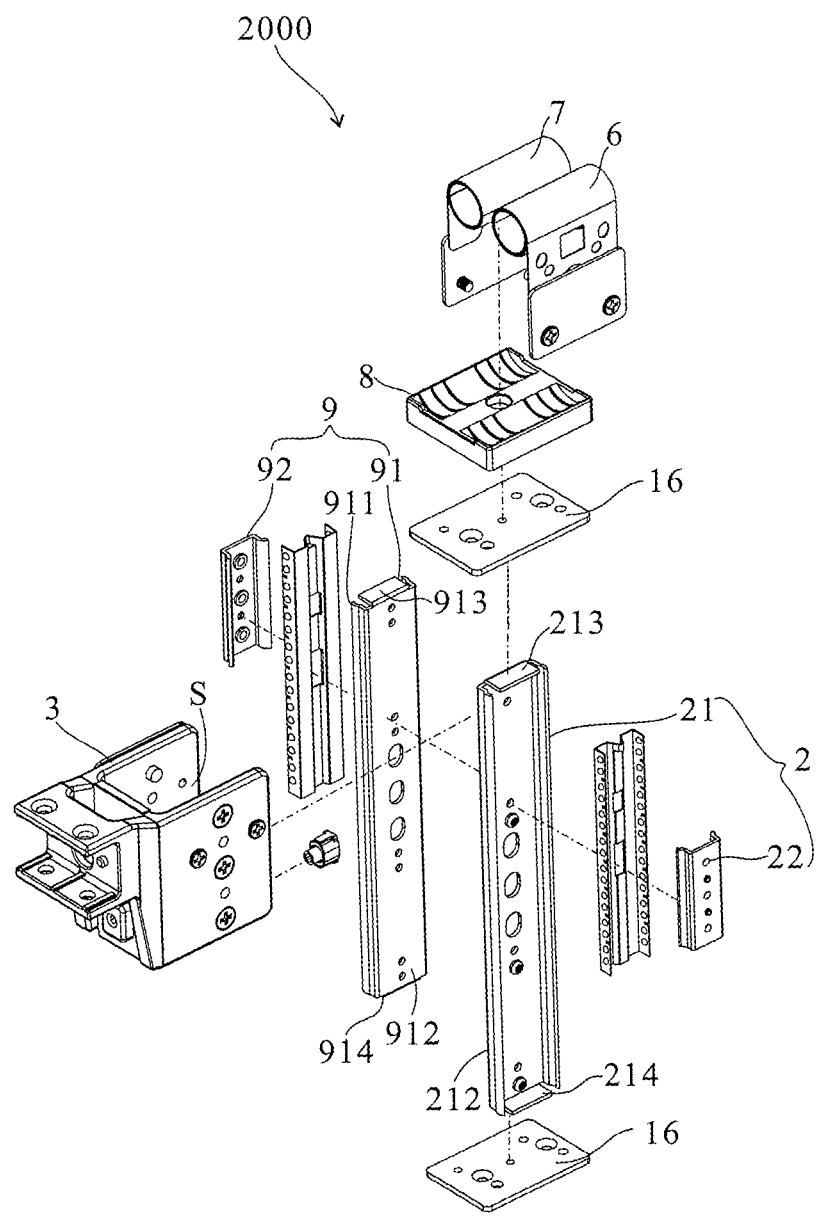
FIG. 12 is a partial exploded view of other embodiments of the elevatable supporting device of the present invention.

In another type of the present embodiment, with reference to FIG. 12, the first top board 213 and the first bottom board 214 of the first outer rail 21, and the second top board 913 and the second bottom board 914 of the second outer rail 91 are fastened to the two platforms 16 of the frame 1 respectively so that the first back board 212 is attached on the second back board 912. Therefore, the platforms 16 are connected to the frame body 11 disclosed in the previous embodiments and in FIG. 2. The first constant force spring 6 and the second constant force spring 7 are disposed on the platforms 16 so as to locate above the first outer rail 21 and the second outer rail 91. Thereby, the first standing board 12, the second standing board 13 and the third standing board 14 can be omitted. Only the first rail module 2 and the second rail module 9 are disposed in the inner space S of the sliding element 3 so that the elevatable supporting device of the present invention can be slimmer.

Figure 13:
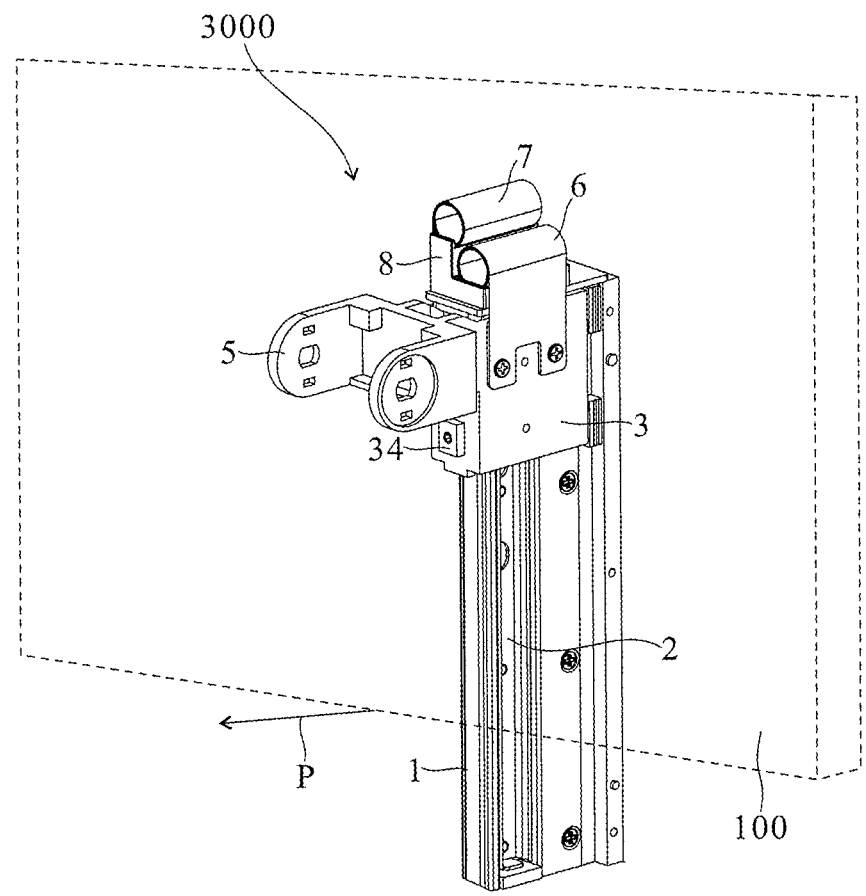
FIG. 13 is a perspective view of the third embodiment of the elevatable supporting device of the present invention.
Figure 14:
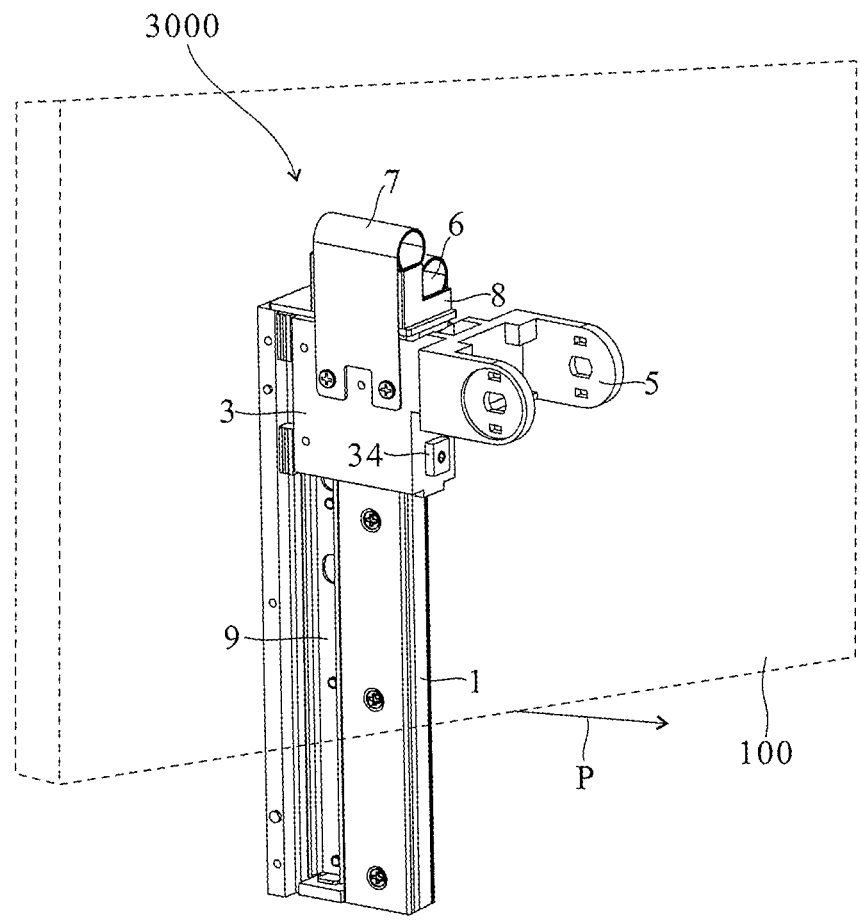
FIG. 14 is another perspective view of the third embodiment of the elevatable supporting device of the present invention.
Figure 15:
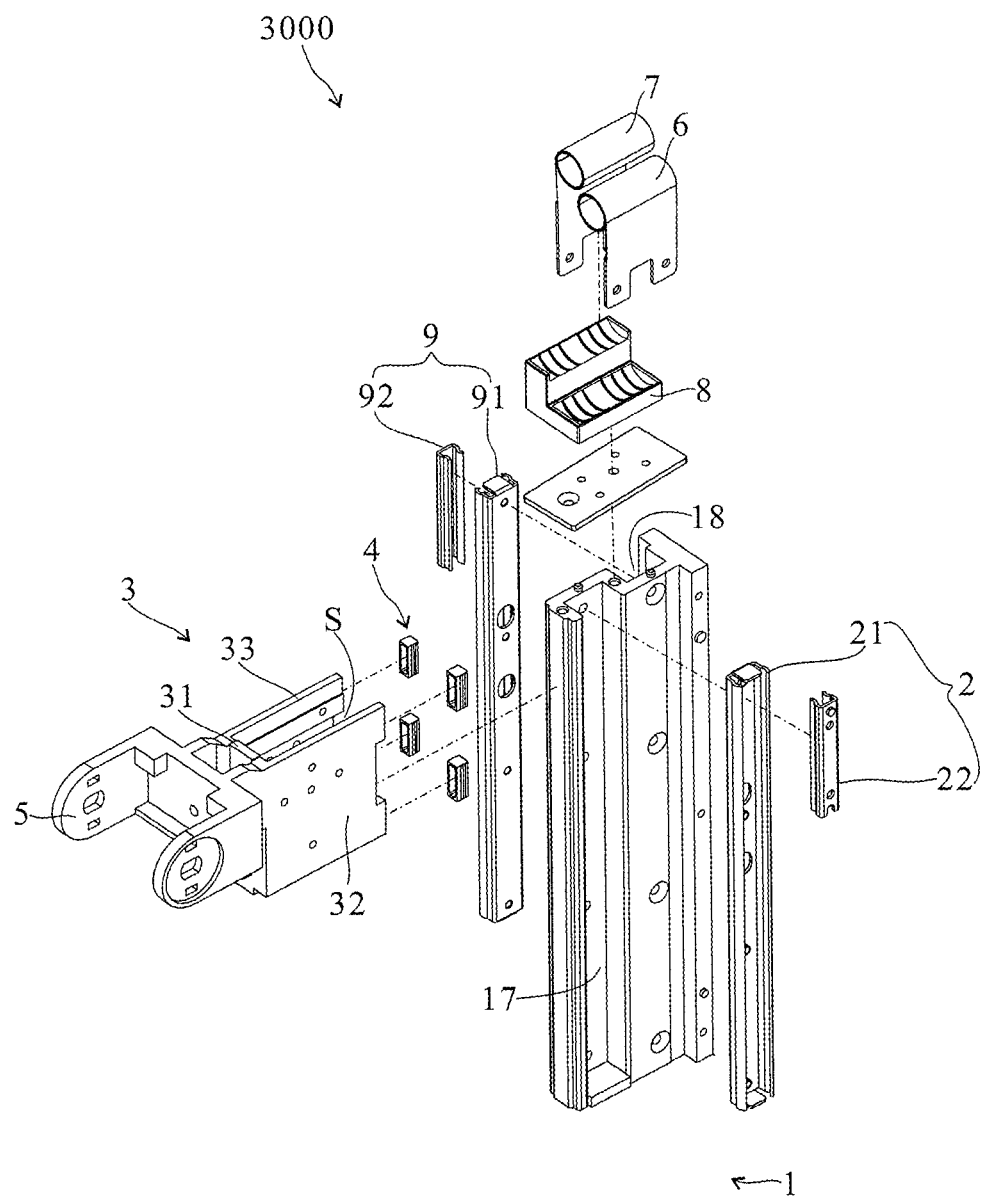
FIG. 15 is an exploded perspective view of the third embodiment of the elevatable supporting device of the present invention.
Figure 16:
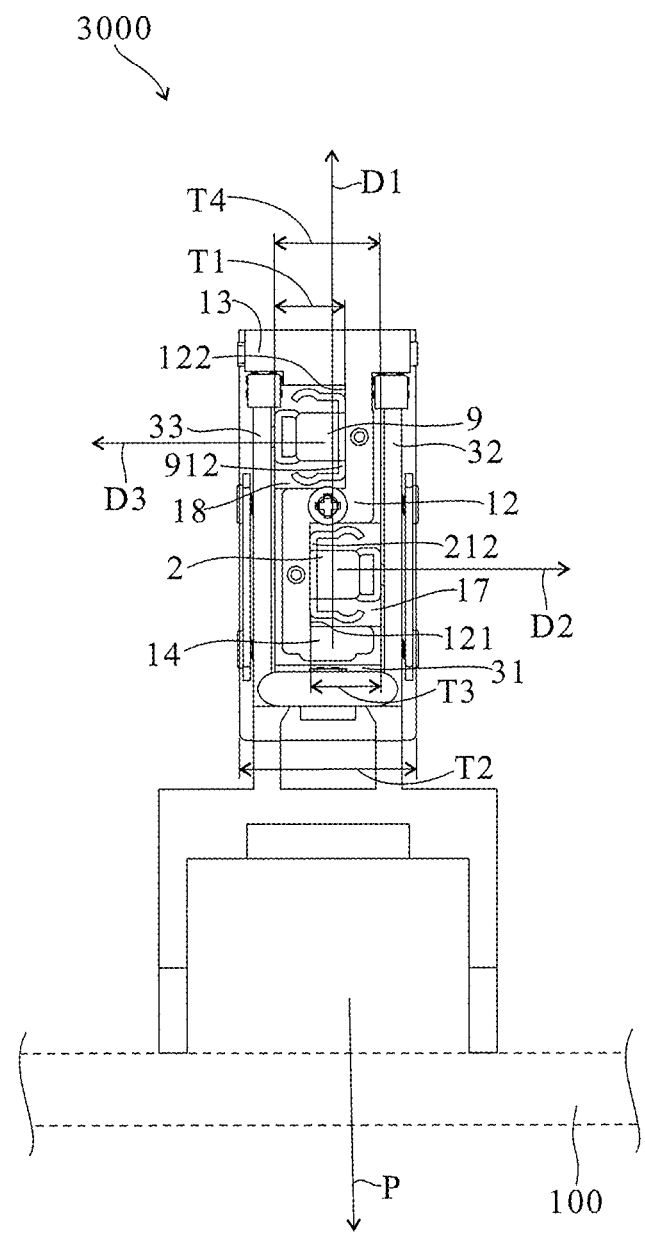
FIG. 16 is a partial top view of the third embodiment of the elevatable supporting device of the present invention.

The third embodiment of the elevatable supporting device 3000 is shown in FIG. 13 to FIG. 16, wherein FIG. 13 and FIG. 14 are perspective views in different view angels, FIG. 15 is an exploded perspective view and FIG. 16 is a partial top view. Similar to the aforesaid embodiments, this embodiment also discloses a frame 1, a first rail module 2, a sliding element 3, a holding body 5, a first constant force spring 6, a second constant force spring 7 and a second rail module 9. The first rail module 2 and the second rail module 9 are disposed in the inner space S as well as being surrounded by the central board 31, the first lateral flange 32 and the second lateral flange 33. The second lateral direction D3 of the second opening 911 of the second outer rail 91 is opposite to the first lateral direction D2 of the first opening 211 and perpendicular to the direction D1 of the opening of the sliding element 3 and the normal direction P.

The different between this embodiment and the second embodiment is that the first groove 17 is beside the second groove 18 so that the first rail module 2 disposed in the first groove 17 is beside the second rail module 9 disposed in the second groove 18 in the present embodiment. That is to say, the first surface 121 and the second surface 122 of the first standing board 12 are staggered to each other; whereas the first back board 212 and the second back board 912 are staggered to each other when the first back board 212 is attached to the first surface 121, and the second back board 912 is attached to the second surface 122. Thus, the first rail module 2 and the second rail module 9 are partially overlapped with respect to the normal direction P. Therefore, even though two rail modules are used in this embodiment, a forth thickness T4 which is the sum of the thickness of the two rail modules is almost equivalent to the first thickness T1 or the third thickness T3, and less than the second thickness T2 of the sliding element 3. In comparison to the second embodiment, the thickness in viewing on the normal direction P can be further reduced in this embodiment. Similarly, the first lateral flange 32 of the sliding element 3 is fastened to the first inner rail 22, and the second lateral flange 33 is fastened to the second inner rail 92 so that the sliding element 3 can slide up and down with respect to the frame 1.

The first friction structure 4 and the second friction structure 34 are also used in this embodiment. The first constant force spring 6 and the second constant force spring 7 are also disposed on top of the frame 1 at different height.

Figure 17:
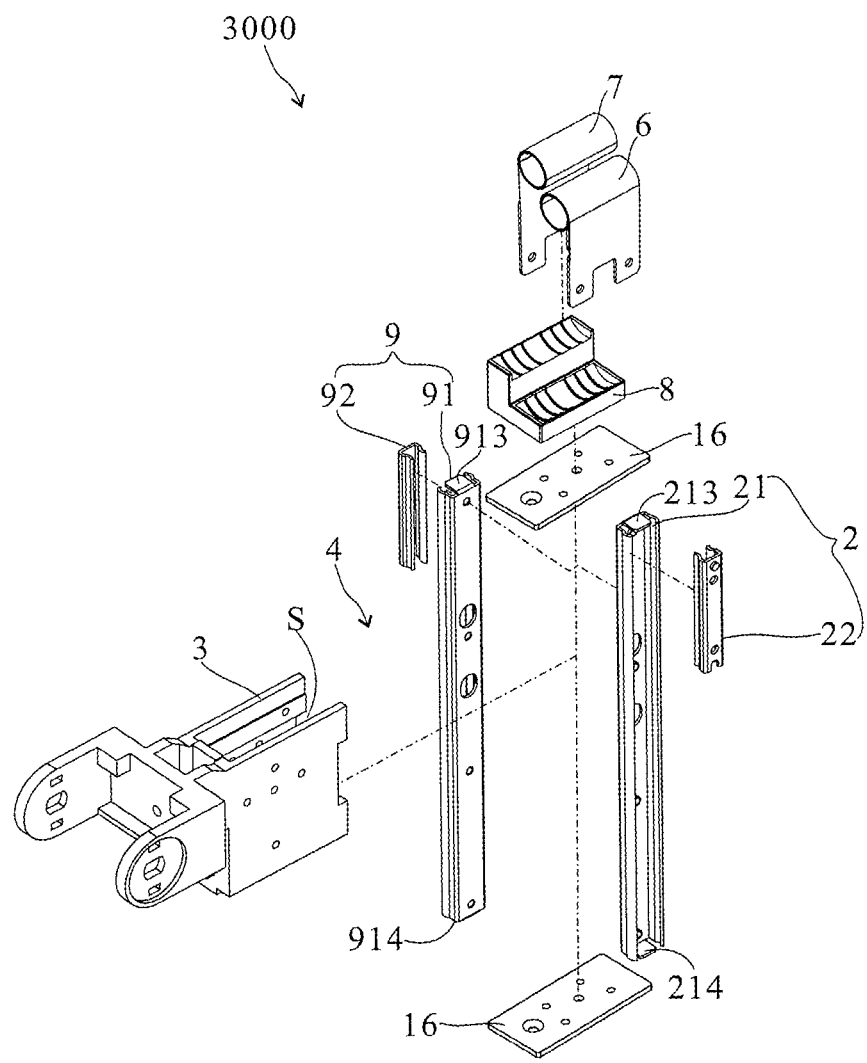
FIG. 17 is a partial exploded view of other embodiments of the elevatable supporting device of the present invention.

In another type of the present embodiment, with reference to FIG. 17, the first top board 213 and the first bottom board 214 of the first outer rail 21, and the second top board 913 and the second bottom board 914 of the second outer rail 91 are fastened between the two platforms 16 of the frame 1. The first rail module 2 and the second rail module 9 are partially overlapped with respect to the normal direction P. The platforms 16 are connected to the frame body 11 (not shown). The first constant force spring 6 and the second constant force spring 7 are disposed on the platforms 16 above the first outer rail 21 and the second outer rail 91. Thereby, the first standing board 12, the second standing board 13 and the third standing board 14 can be omitted so that only the first rail module 2 and the second rail module 9 are disposed in the inner space S of the sliding element 3 to have a thinner elevatable supporting device of the present invention.

In conclusion, in comparison to the conventional elevatable supporting device, the sliding element of the present invention surrounds the rail module and the frame so as to reduce the volume of the elevatable supporting device. Therefore the appearance of the elevatable supporting device can be designed in varieties.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An elevatable supporting device for holding a display module which defines a normal direction, the elevatable supporting device comprising:
    a frame;
    a first rail module, having:
        a first outer rail, being fastened to the frame and forming a first opening, the first opening facing toward a first lateral direction with respect to the normal direction; and
        a first inner rail, being slidably disposed in the first opening;
    a second rail module, having:
        a second outer rail, being fastened to the frame and forming a second opening; and
        a second inner rail, being slidably disposed in the second opening;
    a sliding element, including a central board, a first lateral flange and a second lateral flange to form an inner space for the first rail module and the second rail module penetrating through, the sliding element being fastened to the first inner rail and the second inner rail so as to slide on the frame;
    a first constant force spring, being disposed above the first outer rail and having a free end to be fastened to the first lateral flange; and
    a second constant force spring, being disposed above the second outer rail and having a free end to be fastened to the second lateral flange.

2. The elevatable supporting device as claimed in claim 1, wherein the first lateral flange and the second lateral flange extend from two opposite sides of the central board respectively and substantially perpendicular to the central board so that the sliding element substantially has a U-shaped configuration and is fastened to the first inner rail by the first lateral flange, wherein the central board, the first lateral flange and the second lateral flange define the inner space so as to surround the first rail module.

3. The elevatable supporting device as claimed in claim 2, wherein a direction of an opening of the sliding element is opposite to the normal direction, and the first lateral direction of the first outer rail is perpendicular to the normal direction.

4. The elevatable supporting device as claimed in claim 3, wherein the first rail module has a first thickness with respect to the normal direction and has a first width with respect to the first lateral direction, and the sliding element has a second thickness with respect to the normal direction, wherein the second thickness is less than the first width, and the second thickness is greater than the first thickness.

5. The elevatable supporting device as claimed in claim 4, wherein the frame has two platforms, and a first top board and a first bottom board of the first outer rail are fastened to the platforms respectively.

6. The elevatable supporting device as claimed in claim 5, wherein the second rail module is disposed in the inner space and surrounded by the central board, the first lateral flange and the second lateral flange, wherein the second opening faces toward a second lateral direction with respect to the normal direction, the second lateral direction and the first lateral direction of the first opening are opposite and both substantially perpendicular to the normal direction, and the second inner rail is fastened to the second lateral flange.

7. The elevatable supporting device as claimed in claim 6, wherein the second rail module has a third thickness with respect to the normal direction and has a second width with respect to the second lateral direction, wherein the second thickness is less than the second width, and the second thickness is greater than the third thickness.

8. The elevatable supporting device as claimed in claim 7, wherein a second top board and a second bottom board of the second outer rail are fastened to the platforms respectively.

9. The elevatable supporting device as claimed in claim 8, wherein a first back board of the first outer rail is attached with a second back board of the second outer rail.

10. The elevatable supporting device as claimed in claim 6, further comprising a frame having a first standing board, a second standing board and a third standing board disposed between the first lateral flange and the second lateral flange, wherein the first standing board is attached with a first back board, the second standing board and the third standing board are connected with two ends of the first standing board and perpendicular to the first standing board, and the third standing board is adjacent to the central board.

11. The elevatable supporting device as claimed in claim 10, wherein the frame has a back board for the second standing board being fastened thereto.

12. The elevatable supporting device as claimed in claim 11, further comprising a first friction structure having a plurality of first friction blocks disposed on the first lateral flange and the second lateral flange respectively, the frame further having two forth standing boards connected with two ends of the second standing board, wherein the first friction blocks contact with the forth standing board or the first standing board or the second standing board.

13. The elevatable supporting device as claimed in claim 12, wherein the sliding element further includes a second friction structure having an adjusting button and a second friction block, wherein the adjusting button is capable of selectively adjusting a normal force on the second friction block against the third standing board.

14. The elevatable supporting device as claimed in claim 13, wherein the first standing board, the second standing board and the third standing board define a first groove for the first rail module being disposed therein.

15. The elevatable supporting device as claimed in claim 14, wherein a second back board of the second outer rail is attached on the first standing board, and the first back board of the first outer rail faces toward the second back board of the second outer rail.

16. The elevatable supporting device as claimed in claim 13, wherein the first standing board, the second standing board and the third standing board define a first groove and a second groove, wherein the first rail module is received in the first groove, and the second rail module is received in the second groove.

17. The elevatable supporting device as claimed in claim 7, further comprising a receiving element disposed on the platforms, and a first winding portion of the first constant force spring and a second winding portion of the second constant force spring are disposed on the receiving element.

18. The elevatable supporting device as claimed in claim 17, wherein the first winding portion of the first constant force spring defines a first central axis, the second winding portion of the second constant force spring defines a second central axis, wherein the first central axis and the second central axis are in parallel and perpendicular to the first lateral direction.

19. The elevatable supporting device as claimed in claim 18, wherein the receiving element has a first receiving recess and a second receiving recess to accommodate the first winding portion and the second winding portion respectively, wherein the first receiving groove and the second receiving groove are at different height so that a projection of the first winding portion projected on the platforms partially overlaps a projection of the second winding portion projected on the platforms.

* * * * *